United States Patent [19]

Hayashi

[11] Patent Number: 5,187,456
[45] Date of Patent: Feb. 16, 1993

[54] LINE FILTER
[75] Inventor: Shinichiro Hayashi, Kobe, Japan
[73] Assignee: Mitsubishi Denki Kabushiki Kaisha, Tokyo, Japan
[21] Appl. No.: 587,093
[22] Filed: Sep. 24, 1990
[30] Foreign Application Priority Data
  Sep. 25, 1989 [JP] Japan ................... 1-248812
[51] Int. Cl.⁵ .................... H03H 7/01; H01F 27/28
[52] U.S. Cl. ......................... 333/181; 333/185; 336/69; 336/84 C; 336/180; 336/223
[58] Field of Search ............... 333/185, 166, 177, 181; 336/223, 69, 70, 84 R, 84 C, 180, 181, 182

[56] References Cited
U.S. PATENT DOCUMENTS

| | | | |
|---|---|---|---|
| 3,209,241 | 9/1965 | Book et al. | 336/69 |
| 3,210,703 | 10/1965 | Lockie | 336/69 |
| 3,210,706 | 10/1965 | Book | 336/69 |
| 3,911,332 | 10/1975 | Kunkel | 336/223 X |
| 4,667,173 | 5/1987 | Okochi | 333/177 |
| 4,904,973 | 2/1990 | Ikeda | 336/223 X |
| 4,945,322 | 7/1990 | Okumura | 333/185 X |
| 4,983,934 | 1/1991 | Okumura | 333/185 X |
| 5,012,179 | 9/1991 | Okumura | 336/69 |

Primary Examiner—Thomas J. Kozma
Attorney, Agent, or Firm—Leydig, Voit & Mayer

[57] ABSTRACT

A line filter arranged in such a manner that a foil conductors are used as the coil conductor and the shield plate, and a reactor is formed therein by laminating and winding the foil conductor and the shield plate with an insulating material held therebetween. A line filter arranged in such a manner that a pair of coil blocks connected to each other in parallel is provided on the iron core leg is included in the scope of the invention. Each of the coil blocks is structured in such a manner that the coil conductor and the shield plate made of the foil conductors are stacked and wound via the insulating material. A structure is included within the scope of the invention, the structure having a plurality of filter mechanisms connected to one another in series, each of the filter mechanisms being constituted by a pair of coil blocks connected to each other in parallel.

4 Claims, 5 Drawing Sheets

LINE FILTER

BACKGROUND OF THE INVENTION

1. Field of the Invention

The present invention relates to a line filter to be inserted into the input portion or the output portion of a power source (a single-phase power source).

2. Description of the Related Art

FIGS. 1 and 2 respectively illustrate a conventional line filter disclosed in, for example, "Noise Technology for Electronic Circuit", p.p 116, edited by Yamazaki and published by Ohm Corp. FIG. 1 illustrates an equivalent circuit in an electrical view point and FIG. 2 illustrates an example of the structure of the conventional line filter. FIG. 1 illustrates a combination of a filter reactor 15 and a capacitor 16 for bypassing a noise current. FIG. 2 illustrates the reactor 15 shown in FIG. 1 and arranged in such a manner that two coils 17 and 18 are wound around a core 19, the two coils 17 and 18 being wound symmetrically with respect to the center of the core 19.

In the reactor 15 constituted as described above, although a signal common to the electric circuit does not affect the polarities of the two coils wound as described above, the noise of the same phase is inhibited. Noise, which has passed through the reactor coils 17 and 18 after inputted from input terminals K and L, is bypassed by the capacitor 16 so that the generation of the noise in the load side terminals k and l is prevented. In this case, the capacitor 16 is connected to the reactor 15 via lead wires.

Since the conventional line filter has been constituted as described above, an inductance is undesirably generated due to the presence of the lead wires which are used to connect the capacitor. Therefore, the capacitor may not work as desired in a high frequency range. What is even worse, since the lead wire for establishing the connection of the external capacitor must be shortened, the connection cannot be easily completed. Another problem arises in that the capacitor must have excellent high frequency characteristics.

SUMMARY OF THE INVENTION

Accordingly, an object of the present invention is to provide a line filter capable of overcoming the above-described problems and exhibiting an excellent effect of suppressing high frequency noise without a necessity of connecting an external capacitor.

In order to achieve the above-described object, an aspect of the invention lies in a line filter comprising: an iron core; two coil conductors laminated and wound around the iron core, each of the two coil conductors being in the form of a foil conductor; and a shield plate inserted between the two coil conductors via an insulating material and wound around the iron core together with the coil conductors, the shield plate also being in the form of a foil conductor and grounded, wherein the coil conductors constitute coils and a capacitor is formed between the coil conductor and the shield plate.

A line filter according to the present invention is arranged in such a manner that foil conductors are used as the coil conductor and the shield plate, and the coil of a reactor is formed therein by laminating the foil conductor and the shield plate alternately with an insulating material held therebetween and then winding them around the iron core.

In the line filter according to the present invention, the eddy current loss due to the high frequency can be reduced. Furthermore, the electrostatic capacity obtainable between the foil conductors is utilized so as to make a capacitor for the line filter. That is, the capacitor is formed by the coil conductor and the shield plate laminated via the insulating material and respectively made of the foil conductors.

A line filter, arranged in such a manner that a pair of coil blocks connected to each other in parallel is provided on a iron core leg, is included in the scope of the invention. Each of the coil blocks is structured in such a manner that the coil conductors and the shield plate respectively made of the foil conductors are laminated alternately via the insulating material and wound around the core leg.

Furthermore, a structure is included within the scope of the invention, the structure having a plurality of filter mechanisms connected to one another in series, each of the filter mechanisms being constituted by a pair of coil blocks connected to each other in parallel.

Other and further objects, features and advantages of the invention will appear more fully from the following description.

DESCRIPTION OF THE PREFERRED EMBODIMENTS

An embodiment of the present invention will be described with reference to the drawings.

Figure 1:
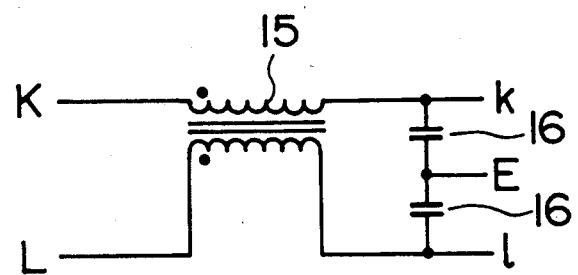
FIG. 1 is an equivalent circuit diagram of a conventional line filter.
Figure 2:
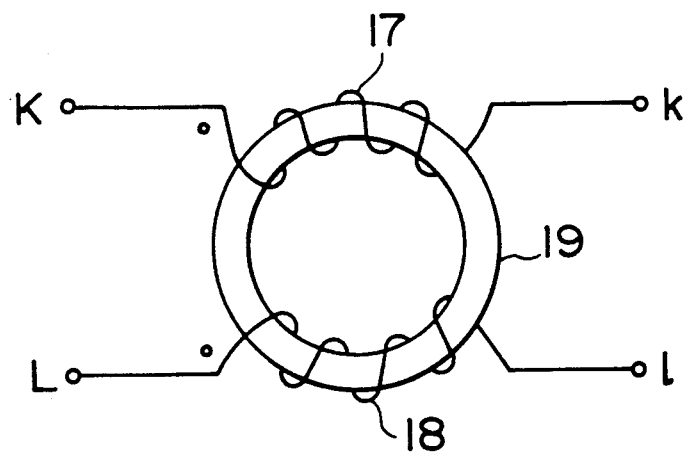
FIG. 2 is a schematic illustration of a reactor of a conventional line filter.
Figure 3:
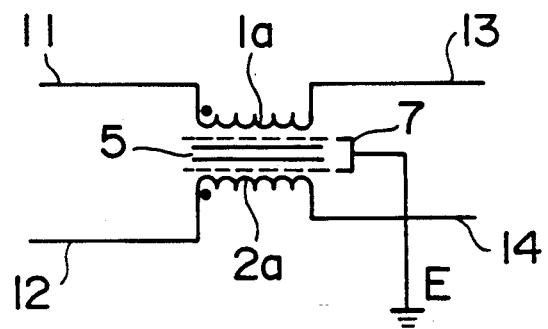
FIG. 3 is an equivalent circuit diagram of a line filter according to a first embodiment of the present invention.

FIG. 3 illustrates an equivalent circuit of a line filter according to an embodiment of the present invention.

Figure 4:
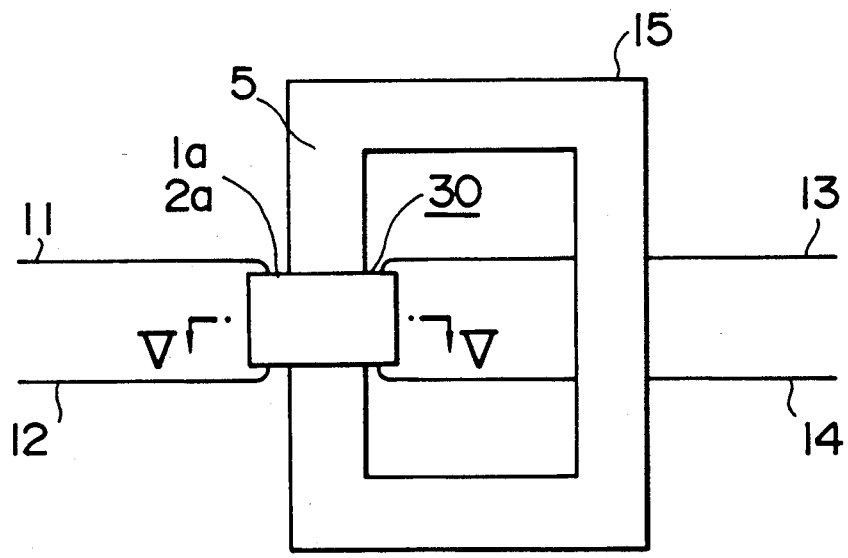
FIG. 4 is a plan view of the line filter according to the first embodiment of the present invention shown in FIG. 3.
Figure 5:
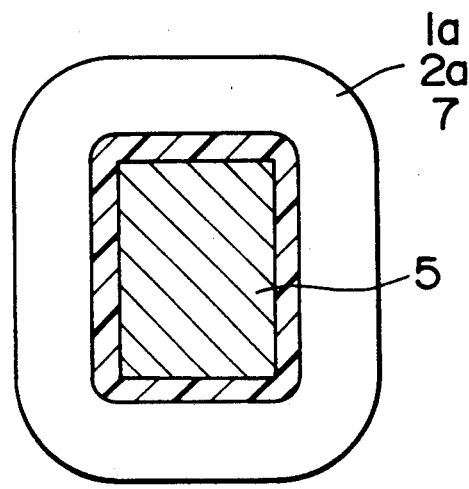
FIG. 5 is a cross sectional view of the coil block taken along line V—V of FIG. 4.
Figure 6:
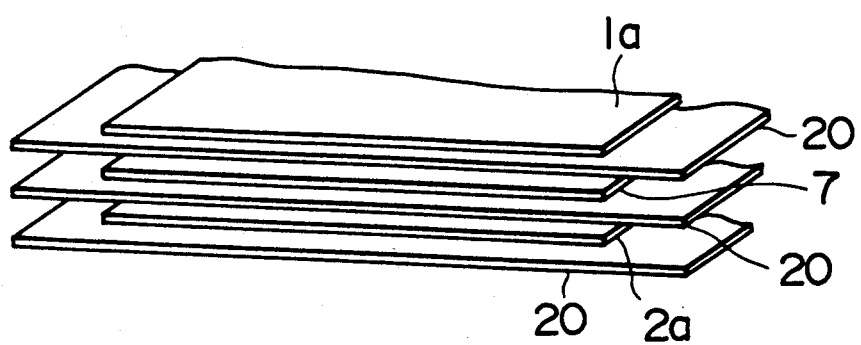
FIG. 6 is a perspective view which partially shows the structure of laminated foil conductors and shield plate to form a coil block of the line filter according to the present invention.

The line filter comprises coils 1a and 2a wound around an iron leg 5 and a shield plate 7 which is also wound together with the coils 1a and 2a. In a case where the line filter is inserted into the output portion of the power source, input terminals 11 and 12 are connected to the power source and terminals 13 and 14 are connected to the load side. In this case, the shield plate 7 is grounded. FIG. 4 is a plan view which illustrates a specific structure of the line filter. A coil block 30, which is manufactured by winding the stacked coils 1a and 2a shown in FIG. 3, is provided on one of the iron core legs 5 of the core type double leg core 15. FIG. 5 is a cross sectional view which illustrates the coil block 30 taken along line V—V of FIG. 4. FIG. 6 illustrates the structure of the coils 1a and 2a which are laminated together with the shield plate 7 and insulating material 20 so as to form the coil block 30. As is shown from the above-described drawings, the coils 1a and 2a which are laminated as described above and the shield plate 7 which is inserted between the two coils 1a and 2a are respectively made of foil conductors. The coil block 30 is formed by winding the lamination structure shown in FIG. 6 around the iron core leg 5, the lamination structure being a structure manufactured by inserting the shield plate 7 between the coils 1a and 2a via an insulating material 20. The coils 1a, 2a and the shield plate 7 of the coil block 30 are closely wound around the iron core leg 5 so as to prevent the generation of a gap in the portion in which they are laminated.

Since the line filter thus structured employs the foil conductors serving as the coils, the eddy current loss due to the high frequency factor can be reduced. Therefore, an efficient reactor can be realized. Furthermore, since there is a large coupling area in the flat portion between the coil conductor and the shield plate, an electrostatic capacity, that is, a capacitor can be formed. Therefore, the undesirable inductance, taken place due to the presence of the lead wire used in the case where the external capacitor is connected in a conventional structure, can be eliminated. As a result, the external capacitor can be omitted from the structure. Consequently, a line filter exhibiting excellent high frequency characteristics without a necessity of providing an external capacitor can be realized.

Figure 7:
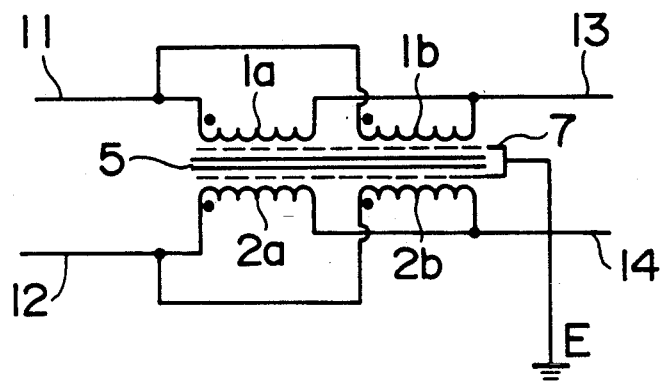
FIG. 7 is an equivalent circuit diagram of the line filter according to a second embodiment of the present invention.
Figure 8:
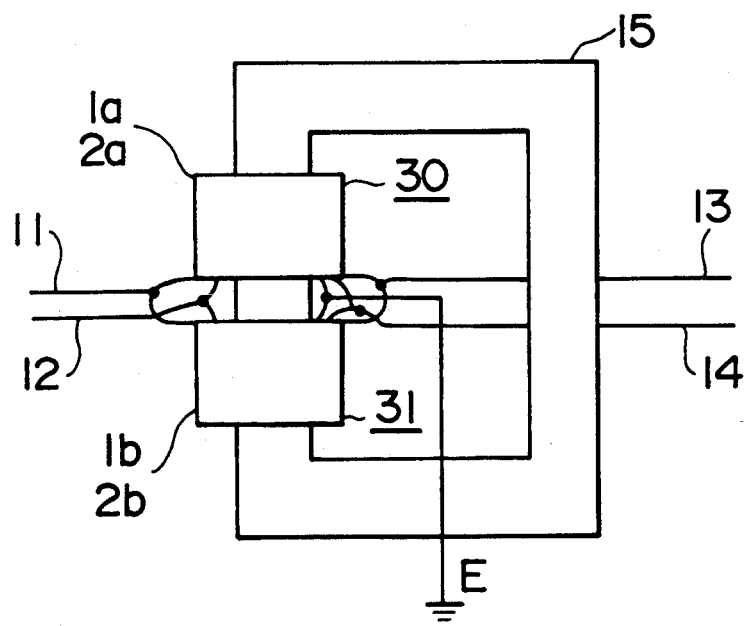
FIG. 8 is a plan view of the line filter according to the second embodiment of the present invention shown in FIG. 7.

FIG. 7 illustrates an equivalent circuit of the line filter according to a second embodiment of the present invention. The line filter comprises coils 1a, 1b, 2a, 2b wound around the iron leg 5 and the shield 7 which are also wound around the leg 5 together with coils. The coils 1a and 1b, respectively serving as first and third coil conductors, are connected to each other in parallel. The coils 2a and 2b, respectively serving as second and fourth coil conductors, are also connected to each other in parallel. FIG. 8 is a plan view which illustrates the specific structure of the second embodiment shown in FIG. 7. The first coil block 30, which is manufactured by winding the laminated coils 1a and 2a shown in FIG. 7, and a second coil block 31, which is manufactured by winding the laminated coils 1b and 2b, are provided on one of the iron core legs 5 of a core type double leg core 15. The above-described two coil blocks 30 and 31 must have the same structure in terms of the dimension, the number of turns, the winding direction and other factors. Furthermore, the structure of the each coil blocks 30, 31 is arranged to be the same as that according to the first embodiment of the present invention shown in FIGS. 5 and 6.

In the line filter according to this embodiment, which is structured in such a manner that a pair of coil blocks are connected to each other in parallel, noise factors respectively inputted to the input terminals 11 and 12 can be compensated each other since the two coil blocks 30 and 31 are disposed symmetrically to each other. Therefore, the iron core 15 is not affected by the leakage flux. Furthermore, either of the two terminals 11 and 12 may be used as the grounding potential line. According to this embodiment, the same effect obtainable according to the first embodiment can, of course, be obtained.

Figure 9:
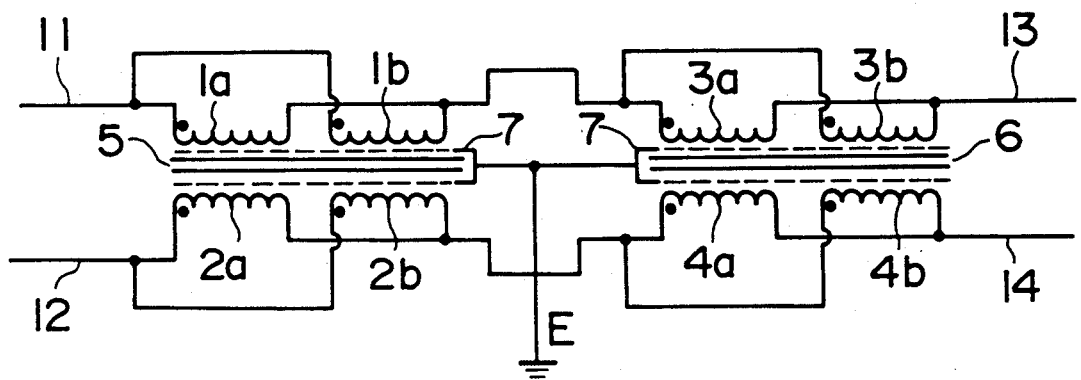
FIG. 9 is an equivalent circuit diagram of the line filter according to a third embodiment of the present invention.
Figure 10:
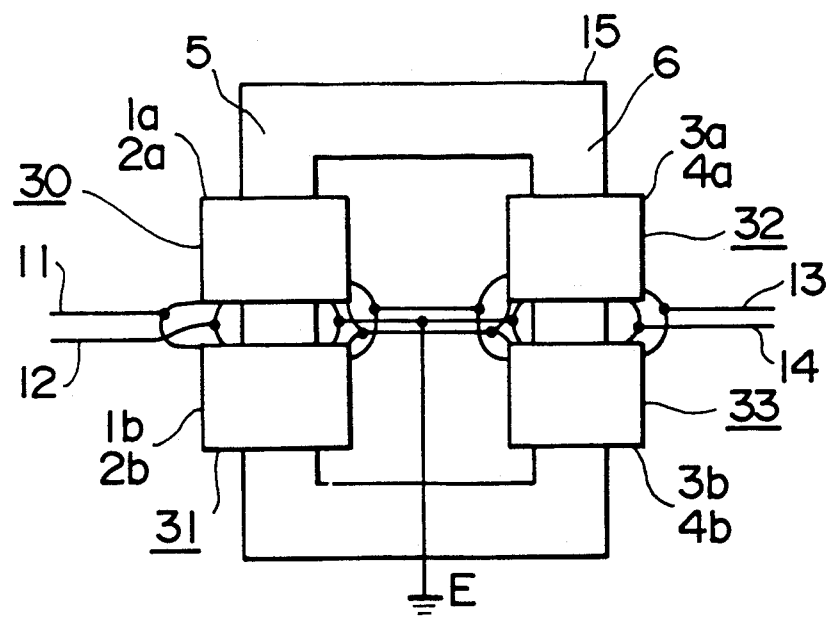
FIG. 10 is a plan view of the line filter according to the third embodiment of the present invention shown in FIG. 9.

FIG. 9 illustrates an equivalent circuit of the line filter according to a third embodiment of the present invention. According to this embodiment, two above-described line filters according to the second embodiment are connected in series so that a two-stage filter is constituted. That is, the first filter comprises coils 1a, 1b, 2a and 2b wound around the iron core leg 5, while the second filter comprises coils 3a, 3b, 4a and 4b wound around the iron core leg 6. Furthermore, the coils 1a and 1b of the first filter are, in series, connected to the coils 3a and 3b of the second filter. The coils 2a and 2b of the first filter are, in series, connected to the coils 4a and 4b of the second filter. FIG. 10 is a plan view which illustrates a specific structure of the third embodiment shown in FIG. 9. The coil block 30, manufactured by winding the laminated coils 1a and 2a shown in FIG. 9, and the second coil block 31, manufactured by winding the laminated coils 1b and 2b, are provided on one of the iron core legs 5 of the core type double leg core 15. As a result, the first filter is constituted. A coil block 32, manufactured by winding the laminated coils 3a and 4a shown in FIG. 9, and a coil block 33, manufactured by winding the laminated coils 3b and 4b, are provided on the other iron core leg 6 of the core type double leg core 15. As a result, the second filter is constituted. The structure of each of the above-described coil blocks 30 to 33 is arranged to be the same as that according to the first embodiment of the present invention shown in FIGS. 5 and 6. Furthermore, as described according to the second embodiment, the above-described coil blocks 30 and 31, as well as coil blocks 32 and 33 must have the same structure in terms of the dimension, the number of turns, the winding direction and other factors respectively. Furthermore, the shield plates 7 which are rolled in respective coil blocks 30 to 33 are connected to one another and then grounded.

As described above, according to this embodiment, a two-stage filter is constituted in such a manner that two filter mechanisms are connected to each other in series, each of the two filter mechanisms being structured by providing a pair of coil blocks (for example, the coils blocks 30 and 31) on the iron core leg. As a result, the filtering effect of the line filter can be further improved. Furthermore, the effect obtainable according to the first and the second embodiments can, of course, be obtained.

According to the third embodiment, another structure may be employed which is arranged in such a manner that the iron core comprises three or more iron core legs each of which has the above-described filter mechanism and the filter mechanisms are connected to one another in series.

What is claimed is:
1. A line filter comprising:
an iron core;
a first coil block including first and second coil conductors laminated and wound around said iron core and made of foil conductors, and a shield plate made of a foil conductor and inserted between said first and second coil conductors via an insulating material and wound around said iron core together with said coil conductors, said shield plate being grounded; and a second coil block including third and fourth coil conductors made of foil conductors and laminated and wound around said iron core and connected to said first and second coil conductors in parallel respectively, and a shield plate made of a foil conductor and inserted between said third and fourth coil conductors via an insulating material and wound around said iron core together with said coil conductors, said shield plate being grounded and said second coil block being arranged in such a manner that the dimension, the number of turns, the winding direction and other factors being the same as those of said first coil block, so that influences of leakage fluxes due to said first and second coil blocks upon said iron core are compensated.

2. A line filter according to claim 1, wherein said iron core has at least two iron core legs, a filter mechanism constituted by said first and second coil blocks is provided for each of said at least two iron core legs and said filter mechanisms are connected to each other in series.

3. A line filter comprising:
an iron core;
a first coil block including first and second foil conductors laminated and wound a number of turns in a particular direction around the iron core; and
a second coil block including third and fourth foil conductors laminated and wound a number of turns in a particular direction around the iron core and respectively connected to the first and second foil conductors in parallel, and the second coil block having the same dimensions, number of turns, and winding direction as the first coil block so that leakage fluxes due to the influences of the first and second coil blocks upon said iron core are compensated.

4. A line filter according to claim 3, wherein the iron core has at least two iron core legs, and including a filter mechanism comprising said first and second coil blocks disposed on each of the iron core legs, wherein the filter mechanisms are connected to each other in series.

* * * * *